US006415001B1

(12) United States Patent
Li et al.

(10) Patent No.: US 6,415,001 B1
(45) Date of Patent: Jul. 2, 2002

(54) SYSTEM AND PROCESS FOR SHARED FREQUENCY SOURCE MULTI-BAND TRANSMITTERS AND RECEIVERS

(75) Inventors: Leo L. Li, Trabuco Canyon; William John Domino, Yorba Linda; Morten Damgaard, Laguna Hills, all of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/203,645

(22) Filed: Dec. 1, 1998

(51) Int. Cl.[7] .............................................. H04L 27/00
(52) U.S. Cl. ...................... 375/259; 375/316; 375/219
(58) Field of Search ................................. 375/259, 316, 375/219, 326, 377, 327, 339, 340

(56) References Cited

U.S. PATENT DOCUMENTS

| 4,888,557 A | 12/1989 | Puckette, IV et al. ...... 329/341 |
| 5,970,408 A | * 10/1999 | Carlsson et al. ............ 455/439 |
| 6,304,146 B1 | * 10/2001 | Welland ........................ 331/2 |

OTHER PUBLICATIONS

Tetsu Sakata, Kazuhiko Seki, Shuji Kubota and Shuzo Kato, π/4–shift QPSK Digital Modulator LSIC for Personal Communication Terminals, NTT Radio Communication Systems Laboratories, PIMRC '94, © IEEE, pp. 472–475.

* cited by examiner

Primary Examiner—Mohammad H. Ghayour
(74) Attorney, Agent, or Firm—Foley & Lardner

(57) ABSTRACT

A communication system for communicating RF signals at any one of a plurality of communication standards through a common antenna is disclosed. The communication system comprises a transmitting unit, a receiving unit, an IF LO frequency generator, an RF LO frequency generator, a reference source, and an antenna. The transmitting unit has a transmit RF information signal output, a modulator for transforming a transmit baseband information signal into a modulated transmit IF information signal, and an upconverter for upconverting the transmit IF information signal into a transmit RF information signal. The receiving unit has a receive RF information signal input, a first downconverter for downconverting a receive RF information signal to a first receive IF information signal, a second downconverter for downconverting the first receive IF information signal to a second receive IF information signal, an analog-to-digital converter for converting the second receive IF information signal to a receive digital information signal, and a digital signal processor for digitally filtering the receive digital information signal. By selecting expedient IF LOs and RF LOs, the IF LO and RF LO frequency generators can be shared between the transmitting and receiving units, and transmit and receive filters can be shared between different communication standards.

31 Claims, 5 Drawing Sheets

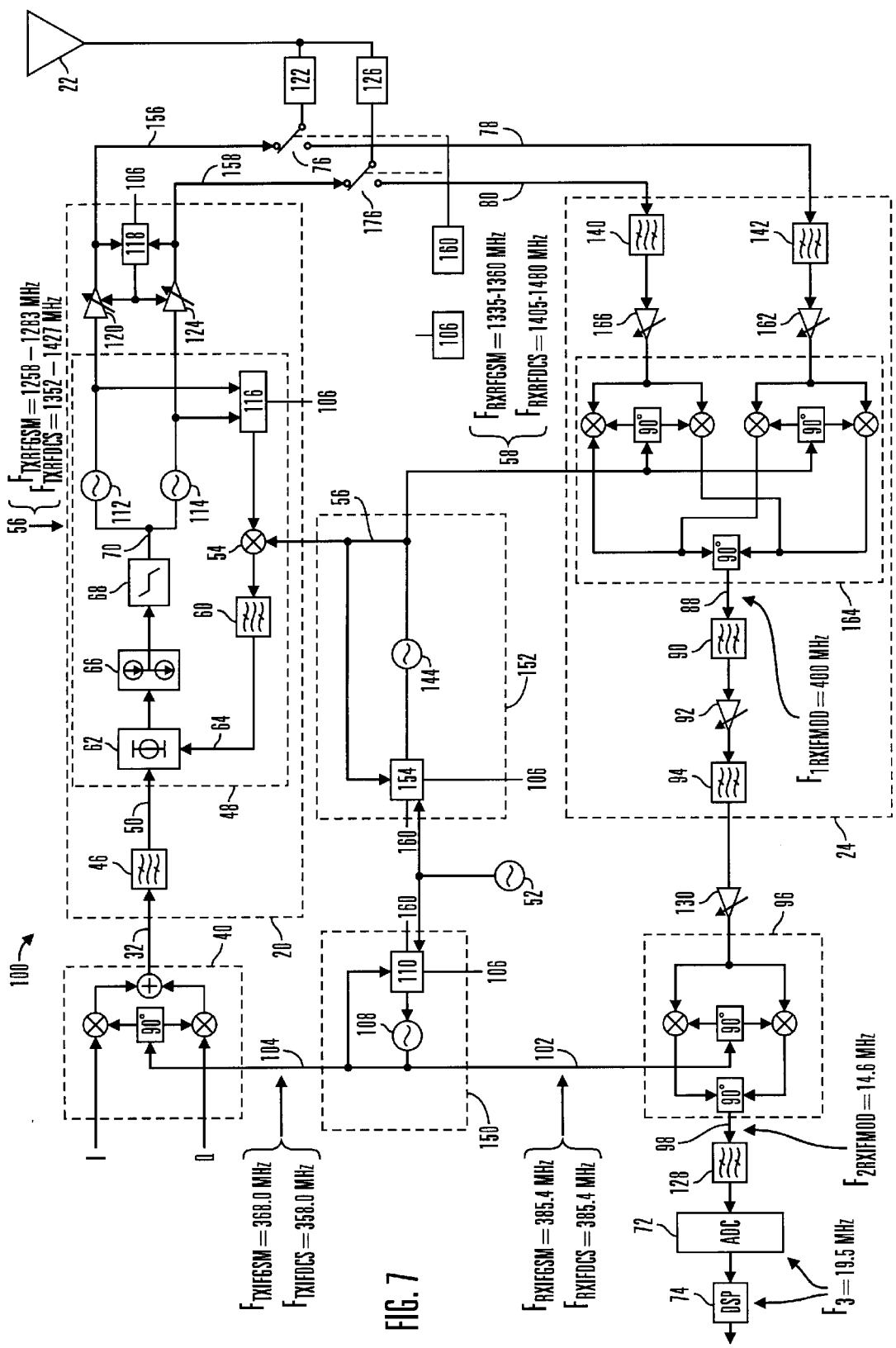

SYSTEM AND PROCESS FOR SHARED FREQUENCY SOURCE MULTI-BAND TRANSMITTERS AND RECEIVERS

BACKGROUND OF THE INVENTION

1. Field of the Invention

The present invention relates, generally, to communication systems and processes which use radio frequency (RF) transmitters and receivers, and, in particular embodiments, to multi-band systems and processes which share frequency sources and filters to minimize size, weight, complexity, power consumption, and cost.

2. Description of Related Art

It has become increasingly important to minimize the size, weight, complexity, power consumption, and cost of various electronic devices, especially personal communication devices such as cellular telephones, personal pagers, cordless telephones, and the like. One way to minimize such characteristics is to minimize the number of components and functions required in the electronic device, or to perform multiple functions using the same components. However, personal communication devices such as cellular telephones often require complex circuitry with a number of power-inefficient components for performing particular functions. This is especially true in modern cellular communications, where several different communication standards are employed worldwide, and cellular telephones with the flexibility to operate under multiple communications standards are highly desirable from a consumer and manufacturing perspective.

For example, GSM900 (Global System for Mobile 900) is a digital cellular standard operating in the 900 MHz frequency band that is currently used in Europe and Asia. DCS1800 is another digital cellular standard based on GSM technology, operating in the 1800 MHz frequency band and also currently used in Europe and Asia. The United States uses PCS1900, a third digital cellular standard similar to DCS1800, but operating in the 1900 MHz band. Multi-band cellular telephones capable of operating under all of these standards afford consumers widespread applicability and allow manufacturers to benefit from the cost-efficiency of a common design.

However, multi-band cellular telephones present a number of design challenges. Conventional single-band transmitters typically require two separate frequencies, a fixed intermediate frequency (IF) for modulation and a tunable radio frequency (RF) for upconversion. Conventional single-band receivers also typically require two separate frequencies, a tunable RF for downconversion and a fixed IF for demodulation. Without the sharing of frequency sources, a single-band cellular telephone may require as many as four different frequency sources. Multi-band cellular telephones exacerbate the problem because the modulation, upconversion, downconversion, and demodulation processes for each band may require different frequencies. Furthermore, the different frequencies employed by each band may require different filters for the transmit and receive function of each band. Size, weight, complexity, power consumption, and cost savings may be achieved by designing multi-band transmitters and receivers to share the same frequency sources and filters.

SUMMARY OF THE DISCLOSURE

Therefore, it is an object of embodiments of the present invention to provide a system and process for a multi-band communication unit that shares frequency sources and filters between bands in the transmitters and in the receivers to minimize size, weight, complexity, power consumption, and cost.

These and other objects are accomplished according to a communication system for communicating RF signals at any one of a plurality of communication standards through a common antenna. Each communication standard has a unique transmit band, receive band, and guard band between the transmit and receive bands, and all communication standards have a common data rate. The communication system comprises a transmitting unit, a receiving unit, an IF LO frequency generator, an RF LO frequency generator, a reference source, and an antenna.

The transmitting unit has a transmit RF information signal output, a modulator for transforming a transmit baseband information signal into a modulated transmit IF information signal, and an upconverter for upconverting the transmit IF information signal into a transmit RF information signal. The receiving unit has a receive RF information signal input, a first downconverter for downconverting a receive RF information signal to a first receive IF information signal, a second downconverter for downconverting the first receive IF information signal to a second receive IF information signal, and an analog-to-digital converter for converting the second receive IF information signal to a receive digital information signal.

The IF LO frequency generator is coupled to the transmitting and receiving units and generates a transmit IF LO and receive-IF LO. The RF LO frequency generator is also coupled to the transmitting and receiving units and generates a transmit RF LO and receive RF LO. The IF LO frequency generator and the RF LO frequency generator are coupled and phase-locked to the reference source. The antenna is coupled to the transmit RF information signal output and the receive RF information signal input for transmitting and receiving RF information signals.

The communication system further includes a second filter coupled between the second mixer and the analog-to-digital converter for filtering the second receive IF information signal,.a first filter coupled between the first mixer and the second mixer for filtering the first receive IF information signal, and a transmit IF filter coupled between the modulator and the translation loop.

In order to share frequency sources and filters between bands in the transmitters and in the receivers, the frequencies of processing clocks, sample rates, and frequency generators and sources, the carrier frequencies of the first and second receive IF information signals, and the center frequencies and bandwidths of the filters are governed by a set of design preferences. These design preferences include:

- selecting the processing clock based on the data rate of a given communication standard,
- selecting the reference frequency and the analog-to-digital converter sample rate based on the requirement that the analog-to-digital converter have a low phase jitter sample clock,
- selecting filters, the analog-to-digital converter sample rate, and the frequency of the first and second receive IF information signals to avoid harmonics of the processing clock,
- selecting the receive RF LO to avoid mixer spurious responses, selecting transmit IF LO, receive IF LO, transmit RF LO and receive RF LO to minimize tuning and settling times of the phase-locked loops in the IF LO frequency generator and the RF LO frequency generator, selecting transmit IF LO and transmit RF LO to minimize zero-crossing spurs, and selecting filters to minimize 4× crossing spurs. Embodiments of the present invention include systems and processes for shared resource multi-band communication units whose frequency generators and sources, carrier frequencies of the first and second receive IF information signals, and center frequencies and bandwidths of the filters satisfy these design preferences.

These and other objects, features, and advantages of embodiments of the invention will be apparent to those skilled in the art from the following detailed description of embodiments of the invention, when read with the drawings and appended claims.

BRIEF DESCRIPTION OF THE DRAWINGS

FIG. 7 is a block diagram representation of dual band communication system according to a preferred embodiment of the present invention.

DETAILED DESCRIPTION OF PREFERRED EMBODIMENTS

In the following description of preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the preferred embodiments of the present invention.

Cellular communication systems employ several different communication standards worldwide. Multi-band cellular telephones, with the flexibility to operate under multiple communications standards, afford consumers widespread applicability and allow-manufacturers to benefit from the cost-efficiency of a common design. Embodiments of the present invention relate to multi-band communication units that share frequency sources and filters between bands in transmitters and in receivers.

It should be noted that multi-band transmitters and receivers according to embodiments of the present invention are not unique to cellular communications and may be employed in a variety of communications electronics, including wireless transmission systems as well as wired systems. Thus, embodiments of the invention described herein may involve various forms of communications systems. However, for purposes of simplifying the present disclosure, preferred embodiments of the present invention are described herein in relation to personal wireless communications systems, including, but not limited to digital mobile telephones, digital cordless telephones, digital pagers, combinations thereof, and the like. Such personal communications systems typically include one or more portable or remotely located receiver and/or transmitter units.

Specifically, for purposes of illustration, the following discussion will focus on cellular communications and two communication standards, GSM900 and DCS1800. In GSM900, frequency bands are allocated such that a mobile subscriber unit will transmit signals over a transmit band of between 890 and 915 MHz and will receive signals over a receive band of between 935 to 960 MHz. The transmit band is broken up into 125 channels, each channel separated by 200 kHz. In DCS1800, frequency bands are allocated such that a mobile subscriber unit will transmit signals over a transmit band of between 1710 and 1785 MHz and will receive signals over a receive band of between 1805 and 1880 MHz. The transmit band is broken up into 375 channels, each channel also separated by 200 kHz. However, references to GSM and DCS below are intended to refer generally to any set of communication standards, and it should be noted that other communication standards such as, but not limited to, EGSM and PCS may also be used.

Figure 1:
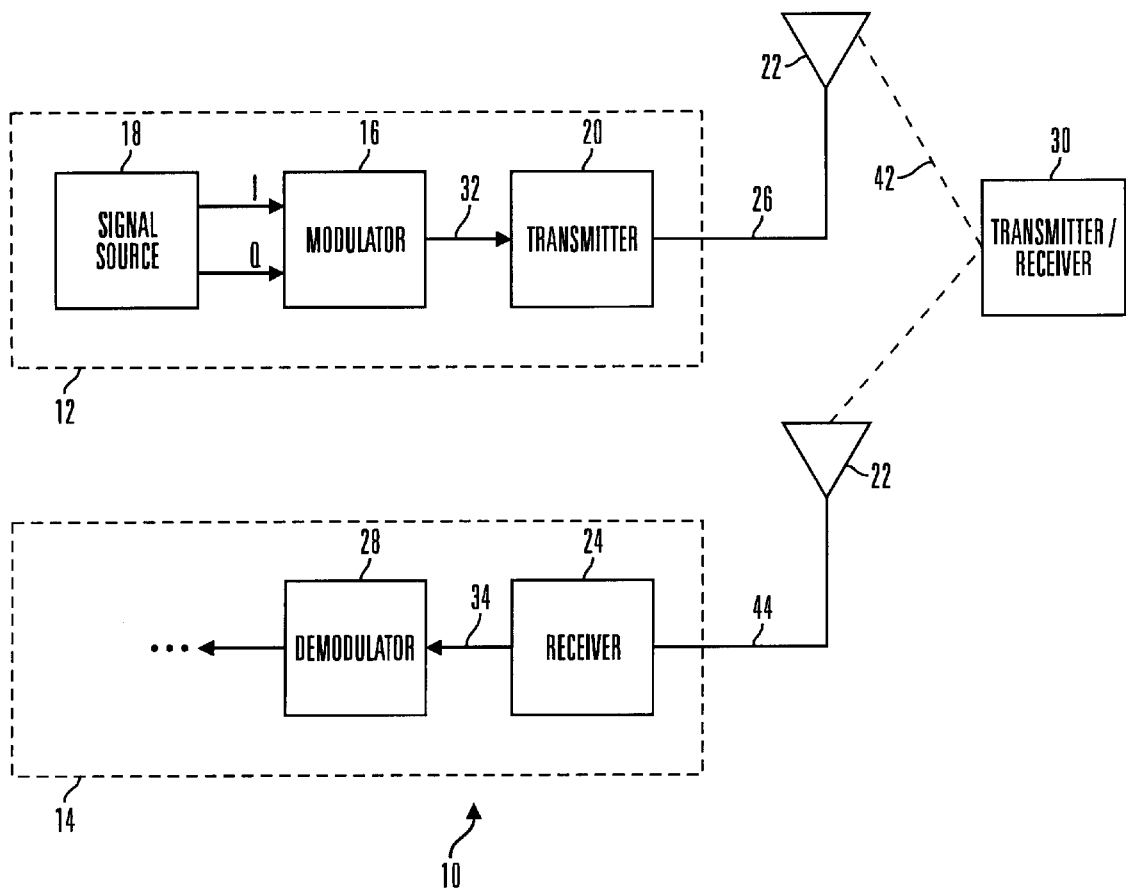
FIG. 1 is block diagram representation of a system environment according to an example embodiment of the present invention.

A generalized representation of a communication system according to an embodiment of the present invention is shown in FIG. 1, wherein a communication system 10 includes a transmitting unit 12 and a receiving unit 14, coupled for communication over a communication channel 42. Transmitting unit 12 includes a modulator 16 coupled to receive a data signal (baseband signal) from a signal source 18. In one representative embodiment, signal source 18 may include, for example, a microphone for converting sound waves into electronic signals and sampling and analog-to-digital converter electronics for sampling and converting the electronic signals into digital signals representative of the sound waves. In other embodiments, signal source 18 may include any suitable device for producing digital data signals for communication over channel 42, such as, but not limited to, a keyboard, a digital voice encoder, a mouse or other user input device, a sensor, monitor or testing apparatus, or the like.

Modulator 16 provides a transmit IF information signal 32 as an output to a transmitter 20. A transmit RF information signal 26 is produced by transmitter 20 for transmission from an antenna 22. Receiving unit 14 includes a receiver 24 connected to an antenna 22 to process a receive RF information signal 44. Receiver 24 provides a modulated receive IF information signal 34 to a demodulator 28 for demodulation to produce the data signal (baseband).

The demodulated (baseband) signal output from demodulator 28 may be provided to signal processing electronics, sound producing electronics or the like, depending upon the nature of use of the communication system. The transmitter and receiver units include further components, power supplies, and the like, well known in the art for effecting transmission and reception of signals and for carrying out other functions specific to the nature and application of use of the system.

In preferred two-way communication system embodiments, such as cellular telephone embodiments or cordless telephone embodiments, each transmitting unit 12 and receiving unit 14 is configured to function as both a transmitting unit and a receiving unit. In one system embodiment, transmitting unit 12 and receiving unit 14 transmit and receive signals directly therebetween. In other system embodiments, transmitting unit 12 and receiving unit 14 communicate through one or more additional transmitter/receiver configurations (such as repeater, base or cell stations), generally represented as reference character 30 in FIG. 1.

Figure 2:
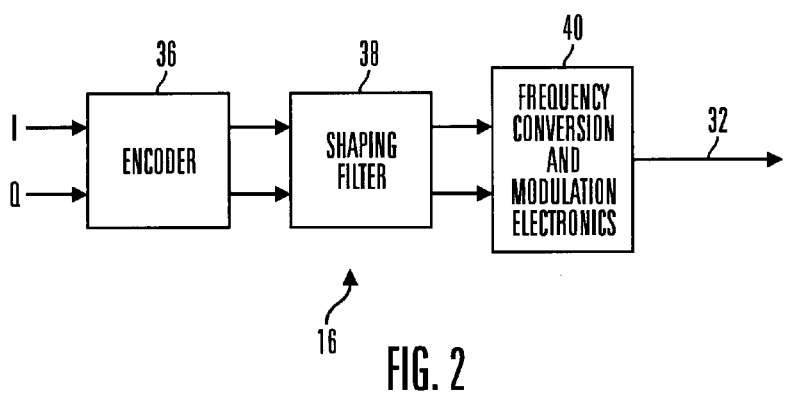
FIG. 2 is a more detailed block diagram representation of the modulator in the system of FIG. 1.

As illustrated in the modulator 16 of FIG. 2, in digital cellular telephone or cordless telephone system embodiments signal source 18 provides sampled voice (or sound) signals in the form of baseband I and Q channel signals to an encoder 36. In one preferred cellular telephone embodiment, encoder 36 comprises a Phase Shift Key encoder, such as, but not limited to, a $\pi/4$-shift Quadrature Phase Shift Key mapper with differential encoder ($\pi/4$ DQPSK), and shaping filter 38 comprises a pulse shaping filter for smoothing the encoder output signal. An example of a $\pi/4$ DQPSK and pulse shaping electronics is described in the article titled: "$\pi/4$-shift QPSK Digital Modulator LSIC for Personal Communication Terminals," by Tetsu Sakata, Kazuhiko Seki, Shuji Kubota and Shuzo Kato, Proc. 5th IEEE International Symposium on Personal, Indoor and Mobile Radio Communications, 1994 (incorporated herein by reference). Other embodiments may employ other suitable encoding schemes, including but not limited to Amplitude Shift Keying and Frequency Shift Keying schemes.

I and Q outputs of the encoder pass through shaping filter 38 and then to frequency conversion and modulation electronics 40, the output of which comprises a transmit IF information signal 32. Transmit IF information signal 32 is then fed to transmitter 20 as shown in FIG. 1, which provides the transmit RF information signal 26 to the antenna 22 for transmission.

Figure 3:
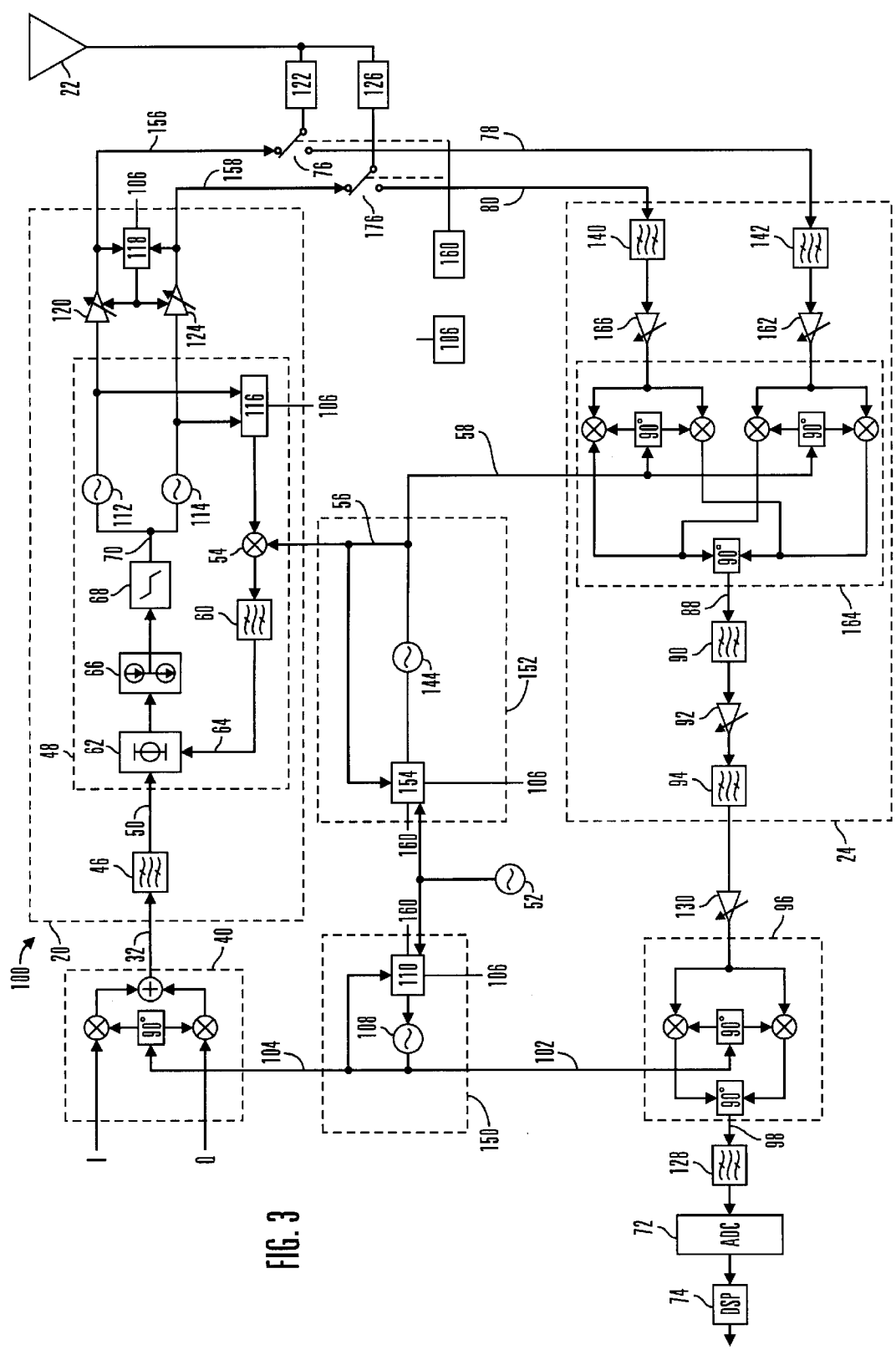
FIG. 3 is a block diagram representation of dual band communication system according to an embodiment of the present invention.

A dual-band communication system 100 according to an embodiment of the present invention is illustrated in FIG. 3. For purposes of illustration and discussion, dual-band communication system 100 of FIG. 3 is switchable between GSM900 and DCS1800 communication standards. However, other embodiments may be switchable between other communication standards.

Frequency conversion and modulation electronics 40 receive the I and Q outputs of shaping filter 38 (see FIG. 2) and modulate a transmit IF LO 104 with the I and Q outputs to produce a transmit IF information signal 32. In preferred embodiments, transmit IF LO 104 is generated by an IF LO frequency generator 150 containing an IF LO frequency source 108 and IF LO loop electronics 110 phase-locked to a reference source 52. However, in alternative embodiments of the present invention, IF LO frequency generator 150 may be any adjustable frequency source.

A transmit IF filter 46, having a bandwidth sufficient to pass transmit IF information signal 32 with minimal distortion, filters transmit IF information signal 32 before it enters an upconverter 48. In preferred embodiments of the present invention, upconverter 48 includes two paralleled frequency generators, a GSM frequency generator 112 for generating GSM carrier frequencies and a DCS frequency generator 114 for generating DCS carrier frequencies. The outputs of GSM frequency generator 112 and DCS frequency generator 114 are selectively couplable to mixer 54 through a switch 116, and are phase-locked to a transmit RF LO 56. In preferred embodiments of the present invention, GSM-frequency generator 112 and DCS frequency generator 114 comprise voltage-controlled oscillators (VCOs). In alternative embodiments of the present invention, switch 116 may comprise an RF switch, a resistor combiner, or a diplexer (two filters coupled together at their outputs).

In preferred embodiments, mixer 54 generates the difference between the frequency at the output of switch 116 and transmit RF LO 56 generated by RF LO frequency generator 152. RF LO frequency generator 152 includes an RF LO frequency source 144 and RF LO loop electronics 154, phase-locked to reference source 52. RF LO frequency source 144 produces frequencies sufficient to generate desired GSM transmit or receive band frequencies and desired DCS transmit or receive band frequencies. In preferred embodiments of the present invention, RF LO frequency source 144 comprises a VCO. In alternative embodiments, RF LO frequency generator 152 may be any adjustable frequency source.

Upconverter 48 further includes a feedback filter 60 for filtering the output of mixer 54 to remove mixer noise, a phase detector 62 for determining the phase difference between a filtered mixer output 64 and filtered transmit IF information signal 50, a charge pump 66 for sourcing or sinking current as determined by the phase difference output of phase detector 62, and a loop filter 68 for integrating current pulses from charge pump 66 and providing a control voltage 70 to GSM frequency generator 112 and DCS frequency generator 114. In alternative embodiments, a feed-forward divider (not shown in FIG. 3) may be coupled between transmit IF filter 46 and phase detector 62, and a feed-back divider (not shown in FIG. 3) may be coupled between feedback filter 60 and phase detector 62 to divide the signals down to a lower frequency such that phase detector 62 is easier to implement. In other alternative embodiments, upconverter 48 may comprise a mixer for mixing filtered transmit IF information signal 50 with transmit RF LO 56.

A GSM power amplifier 120 is controllable by a power amplifier controller 118 and is coupled between GSM frequency generator 112 and a GSM T/R switch 76 to generate a GSM transmit RF information signal 156. Similarly, a DCS power amplifier controllable by power amplifier controller. 18 is coupled between DCS frequency generator 114 and a DCS T/R switch 176 to generate a DCS transmit RF information signal 158. Power amplifier controller 118 receives baseband control signals (not shown in FIG. 3), senses the output power of GSM power amplifier 120 and DCS power amplifier 124, and adjusts the amplification of GSM power amplifier 120 and DCS power amplifier 124 based on these inputs and a predetermined ramping profile. A GSM harmonic filter 122 is coupled between GSM T/R switch 76 and antenna 22 to pass GSM transmit and receive band frequencies and suppress harmonics of GSM transmit RF information signal 156 generated by GSM power amplifier 120. A DCS harmonic filter 126 is coupled between DCS T/R switch 176 and antenna 22 to pass DCS transmit and receive band frequencies and suppress harmonics of DCS transmit RF information signal 158 generated by DCS power amplifier 124. Thus, GSM harmonic filter 122 and DCS harmonic filter 126 are simultaneously coupled to antenna 22.

Switch 116, RF LO loop electronics 154, IF LO loop electronics 110, and power amplifier controller 118 are all coupled to and controllable by band selector 106. In preferred embodiments of the present invention, band selector 106 is a processing device automatically configurable by remote commands or signal strength measurements received from base stations. In alternative embodiments, band selector 106 may comprise a factory-programmable logic device or user-configurable logic. When band selector 106 is configured for GSM operation, switch 116 selects GSM frequency generator 112 and power amplifier controller 118 enables GSM power amplifier 120 and disables DCS power amplifier 124. When band selector 106 is configured for DCS operation, switch 116 selects DCS frequency generator 114 and power amplifier controller 118 enables DCS power amplifier 124 and disables GSM power amplifier 120.

IF LO loop electronics 110 and RF LO loop electronics 154 are also controllable by transmit/receive selector circuit 160. In preferred embodiments of the present invention, transmit/receive selector circuit 160 is a processing device which is continuously switching between transmit mode and receive mode in a fixed time pattern. When band selector 106 is configured for GSM operation and transmit/receive selector circuit 160 is configured for transmit operation, IF LO loop electronics 110 is configured and, IF LO frequency source 108 is tuned in accordance with a designated GSM transmit IF, and RF LO loop electronics 154 is configured and RF LO frequency source 144 is tuned in accordance with a designated GSM transmit band. When band selector 106 is configured for GSM operation and transmit/receive selector circuit 160 is configured for receive operation, IF LO loop electronics 110 is configured and IF LO frequency source 108 is tuned in accordance with a designated GSM receive IF, and RF LO loop electronics 154 is configured and RF LO frequency source 144 is tuned in accordance with a designated GSM receive band. When band selector 106 is configured for DCS operation and transmit/receive selector circuit 160 is configured for transmit operation, IF LO loop electronics 110 is configured and IF LO frequency source 108 is tuned in accordance with a designated DCS transmit IF, and RF LO loop electronics 154 is configured and RF LO frequency source 144 is tuned in accordance with a designated DCS transmit band. When band selector 106 is configured for DCS operation and transmit/receive selector circuit 160 is configured for receive operation, IF LO loop electronics 110 is configured and IF LO frequency source 108 is tuned in accordance with a designated DCS receive IF, and RF LO loop electronics 154 is configured and RF LO frequency source 144 is tuned in accordance with a designated DCS receive band.

When GSM T/R switch 76 and DCS T/R switch 176 are switched to receiver 24 for operating communication system 10 in receive mode, GSM harmonic filter 122 passes the GSM receive band frequencies of a GSM receive RF information signal 78 to GSM receive RF filter 142, and DCS harmonic filter 126 passes the DCS receive band frequencies of a DCS receive RF information signal 80 to DCS receive RF filter 140. If band selector 106 is configured for GSM operation, an adjustable gain DCS downconverter amplifier 166 is disabled, while an adjustable gain GSM downconverter amplifier 162 amplifies the output of GSM receive RF filter 142. If band selector 106 is configured for DCS operation, the adjustable gain GSM downconverter amplifier 162 is disabled, while the adjustable gain DCS downconverter amplifier 166 amplifies the output of DCS RF receive filter 140. The gain of GSM downconverter amplifier 162 and DCS downconverter amplifier 166 is controlled by a processing device (not shown in FIG. 3), based on the amplitude of signals reaching ADC 72. The amplified signal is then translated into a first receive IF information signal 88 by a first downconverter 164, utilizing a receive RF LO 58 from RF LO frequency generator 152. Downconverting is performed to reduce the desired receive RF information signal (which could be any receive band frequency of the particular communication standard) to a fixed receive IF information signal so that a tuned narrowband filter can pass only the fixed receive IF information signal.

First receive IF information signal 88 is then filtered by a first narrowband receive IF filter 90 to remove any unwanted-channel signals as well as spurious frequencies generated by first downconverter 164, and amplified by an adjustable first downconverter amplifier 92, and filtered again by a second downconverted receive filter 94 to reject noise generated by first downconverter amplifier 92. The filtered signal is then amplified by an adjustable second downconverter amplifier 130 and downconverted a second time by a second downconverter 96 to produce second receive IF information signal 98. The second receive IF information signal 98 is then filtered by second narrowband receive IF filter 128 and processed by an IF-sampling analog-to-digital converter (ADC) 72, resulting in digitally modulated baseband data for demodulation by a digital signal processor (DSP) 74.

Communication standards typically operate at a fixed data rate. For example, the GSM, DCS, and PCS communication standards operate at a fixed data rate of 270.833 kbits/sec. It is advantageous to have a processing clock ($F_C$) for operating DSP 74 that is four times the data rate, or $F_C=1.08333$ MHz in the example under discussion, in order to properly extract the data signal and I and Q from the carrier. This processing clock is a square wave that drives many digital circuits and generates many higher-order harmonics, so filters in the receiver chain should not have a passband covering $P^*F_C$, where P is a positive integer, for such a passband would allow one of these harmonics to be downconverted and demodulated. Thus, it is a design preference that $PB_{1RXIF} \neq P^*F_C$ and $PB_{2RXIF} \neq P^*F_C$, where $PB_{1RXIF}$ is the passband of first narrowband receive IF filter 90 and $PB_{2RXIF}$ is the passband of second narrowband receive IF filter 128.

The use of an IF-sampling ADC 72 in embodiments of the present invention creates other design preferences. In embodiments of the present invention, rather than demodulating the filtered first receive IF information signal 88 to baseband, second downconverter 96 downconverts the filtered first receive IF information signal 88 to second receive IF information signal 98 using receive IF LO 102 from IF LO frequency generator 150. Second receive IF information signal 98 is then processed by IF-sampling ADC 72 which translates second receive IF information signal 98 down to baseband. This method of generating a baseband signal eliminates the need for the selectable gain baseband amplifiers and low pass filters found in conventional demodulators, because IF-sampling ADC 72 can receive a wider range of amplitudes at its inputs. The gain is adjusted later, in DSP 74. Instead, a second narrowband receive IF filter 128 is used before the IF-sampling ADC 72 to filter out mixer noise generated by second downconverter 96.

However, because the sample clock (and therefore the sample rate $F_S$) in IF-sampling ADC 72 should have low phase jitter, obtainable only by directly dividing down reference source 52 ($F_{REF}$), IF-sampling ADC 72 imposes a design preference that $F_{REF}$ be an integer multiple of the sample rate ($F_{REF}=M^*F_S$, where M is a positive integer).

The sample rate $F_S$ should also be chosen such that there exists a second receive IF information signal 98 and aliases of second receive IF information signal 98 whose frequencies do not substantially coincide with any harmonics of the signal processing clock ($P^*F_C$). Aliasing is a phenomenon wherein sampled analog data at different frequencies is converted into the same digital data, and occurs in ADCs having a sample rate of $F_S$ when the carrier frequency of the sampled data is:

$N^*F_S/4$, where N=1, 3, 5, . . .

In other words, it is a further design preference that $F_S$ be chosen such that the odd-order multiples of $F_S/4$ do not contain harmonics of $F_C$. The sample rate at which no aliases of the sample rate coincide with harmonics of $F_C$ is:

$$F_S=(P*F_C-F_C/Q)*4,$$

where $F_C$ is the signal processing clock, P is a positive integer, and Q=2, 4, 6, . . . INT($F_C/(BW/2)$), where BW=channel bandwidth.

In preferred embodiments, $F_S$=19.5 MHz satisfies the above equation, because second receive IF information signal 98 is at a frequency of N*(19.5 MHz)/4, where N=1, 3, 5, . . . , and thus do not coincide with any harmonics of the $F_C$=1.08333 MHz signal processing clock. In addition, in preferred embodiments M=1 and therefore $F_S=F_{REF}$=19.5 MHz. It should be emphasized for clarity that processing clock $F_C$ is not the same as the sample rate $F_S$ used by IF-sampling ADC 72. The analog data is sampled by the IF-sampling ADC 72 at a sample rate $F_S$ of 19.5 MHz, then the sampled data is decimated in DSP 74 by a factor of 18, to 1.08333 MHz (which is four times the data rate), using a processing clock $F_C$ of 1.08333 MHz.

Although any alias of second receive IF information signal 98 will produce the same result, in preferred embodiments of the present invention, N=3 and therefore 3*(19.5 MHz)/4≈14.6 MHz is chosen as the approximate center frequency of second receive IF information signal 98. 14.6 MHz is chosen so that an off-the-shelf, relatively inexpensive narrowband ceramic filter with a center frequency of about 14.6 MHz could be used as second receive IF filter 128, and because it simplifies the divider ratios in IF LO frequency generator 150. In embodiments of the present invention, the bandwidth of second receive IF filter 128 encompasses the modulation bandwidth of second receive IF information signal 98. In preferred embodiments of the present invention, second receive IF filter 128 has a bandwidth of about 300 kHz. In addition, a second receive IF filter 128 with a center frequency of about 14.6 MHz satisfies the previously mentioned design preference that $PB_{2RXIF} \neq P*F_C$, where P=1, 2, 3, . . . and $PB_{2RXIF}$ is the passband of second narrowband receive IF filter 128.

Another design preference is created by the need to avoid mixer spurious responses created when undesired receive frequencies and harmonics are mixed within receiver 24. For example, a GSM receive RF information signal 78 at a desired frequency $F_{RXRFMODGSM}$ may be mixed with a receive RF LO 58 at a desired frequency $F_{RXRF}$ to produce a first receive IF information signal 88 at a desired frequency ($F_{1RXIFMOD}$). However, because first downconverter 164 is a nonlinear device, harmonics of receive RF LO 58 and receive RF information signal 78 will be generated within first downconverter 164. Thus, undesired frequencies in receive RF information signal. 78 received from antenna 22 may be mixed with an undesired harmonic of receive RF LO 58 to produce an undesired signal at the frequency $F_{1RXIFMOD}$. More generally, two undesired harmonics of receive RF LO 58 or receive RF information signal 78 may also be mixed to produce an undesired signal at the frequency $F_{1RXIFMOD}$. These are mixer spurious responses. Only low order harmonics need be considered, for higher order harmonics have less RF power and generally do not produce mixer spurious responses large enough to violate system noise requirements.

Receive RF LO 58 should therefore be chosen such that undesired harmonics of receive RF LO 58 capable of combining with harmonics of receive RF information signal 78 to generate the frequency $F_{1RXIFMOD}$ are of such high order that their power level is within system noise specifications. In preferred embodiments of the present invention, receive RF LO 58 is selected such that any harmonics capable of producing $F_{1RXIMFMOD}$ are on the order of about 3 or higher.

Thus, the selection of $F_{1RXIFMOD}$ and $F_{RXRF}$ involves the following competing preferences:

$F_{1RXIFMOD}$ should be chosen such that the passband of first narrowband receive IF filter 90 does not cover a harmonic of $F_C$ to avoid processing clock harmonics.

$F_{RXRF}$ should be chosen such that no low-order harmonics of $F_{RXRF}$ and receive RF information signal 78 can be combined to form $F_{1RXIFMOD}$ to avoid mixer spurious responses.

In preferred embodiments of the invention, because off-the-shelf 400 MHz SAW filters are available and a first receive IF information signal 88 with a center frequency of approximately 400 MHz avoids harmonics of the 1.08333 MHz signal processing clock, 400 MHz is selected as the desired center frequency of first receive IF information signal 88.

Once the desired center frequency of first receive IF information signal 88 is selected, the frequency range of receive RF LO 58 can be determined. In an embodiment of the present invention, in GSM operation first downconverter 164 produces an output representing GSM receive RF information signal 78 subtracted from receive RF LO 58. Thus, $$F_{1RXIFMOD}=F_{RXRFGSM}-F_{XRFMOD},$$

and therefore

400 MHz=$F_{RXRFGSM}$-the GSM receive band,

400 MHz=$F_{RXRFGSM}$-(935 to 960 MHz), and $F_{RXRFGSM}$=1335 to 1360 MHz,
where $F_{RXRFGSM}$=tuning range of receive RF LO 58 for GSM.

Selecting $F_{RXRFGSM}$=1335 to 1360 MHz also satisfies the design preference that $F_{RXRF}$ should be chosen such that no low-order harmonics of $F_{RXRF}$ can be combined to form $F_{1RXIFMOD}$.

Similarly, in DCS operation first downconverter 164 produces an output representing receive RF LO 58 subtracted from GSM receive RF information signal 78. Thus, $$F_{1RXIFMOD}=F_{RXRFMOD}-F_{RXRFDCS},$$

and therefore 400 MHz=the DCS receive band–$F_{RXRFDCS}$,

400 MHz=(1805 to 1880 MHz)–$F_{RXRFDCS}$, and $F_{RXRFDCS}$=1405 to 1480 MHz,
where $F_{RXRFDCS}$=tuning range of receive RF LO 58 for DCS.

Selecting $F_{RXRFDCS}$=1405 to 1480 MHz also satisfies the design preference that $F_{RXRF}$ should be chosen such that no low-order harmonics of $F_{RXRF}$ can be combined to form $F_{1RXIFMOD}$.

In addition, once the desired center frequency of first receive IF information signal 88 is selected, the design preferences of first narrowband receive IF filter 90 can be established. Because the desired center frequency of first receive IF information signal 88 is about 400 MHz, the center frequency of first narrowband receive IF filter 90 is also selected to be approximately 400 MHz.

Unlike transmit IF filter 46, first narrowband receive IF filter 90 should have a narrow passband. Considering again the GSM communication standard for purposes of illustration only, GSM receive RF information signal 78 from antenna 22 includes both desired receive RF information at a particular GSM receive band and undesired receive RF information at other nearby receive bands. Thus, although GSM receive RF information signal 78 is downconverted to a first receive IF information signal 88, the first receive IF information signal 88 will include both desired receive IF information at a desired frequency and undesired receive RF information at frequencies near the desired frequency. First narrowband receive IF filter 90 should therefore be used to pass only the desired receive IF information at the desired frequency. In embodiments of the present invention, the bandwidth of first narrowband receive IF filter 90 is no greater than approximately the modulation bandwidth of first receive IF information signal 88. In preferred embodiments of the present invention, first narrowband receive IF filter 90 has a bandwidth of about 300 kHz and is implemented by a relatively small, simple, and low-cost surface acoustic wave (SAW) filter.

Because second receive IF information signal 98 equals the receive IF LO 102 subtracted from the 400 MHz filtered first receive IF information signal 88, receive IF LO 102 is approximately 400 MHz–14.6 MHz=385.4 MHz, regardless of whether GSM or DCS is the operative communication standard. An additional advantage of designing first receive IF information signal 88 to be 400 MHz and second receive IF information signal 98 to be 14.6 MHz is that the dividers in IF LO loop electronics 110 are simplified when generating a 385.4 MHz receive IF LO 102 as compared to other frequencies.

A set of interrelated design preferences informs the selection of transmit IF LO 104, the passband of transmit IF filter 46, and transmit RF LO 56. IF LO frequency generator 150 includes an IF LO frequency source 108 that should be tunable to generate both GSM receive IF ($F_{RXIFGSM}$) and DCS receive IF ($F_{RXIFDCS}$) at 385.4 MHz, as well as GSM transmit IF ($F_{TXIFGSM}$) and DCS transmit IF ($F_{TXIFDCS}$). However, to achieve the goal of utilizing the same IF LO frequency source 108 to generate these frequencies, the difference between these frequencies should not be too great, otherwise the tuning and settling times of the phase-locked loop (PLL) within IF LO frequency generator 150 may be too long. In preferred embodiments of the present invention, $F_{RXIFGSM}$ and $F_{TXIFGSM}$ are selected to vary from each other by not more than about 10%, and $F_{RXIFDCS}$ and $F_{TXIFDCS}$ are selected to vary from each other by not more than about 10%. Thus, because $F_{RXIFGSM}=F_{RXIFDCS}=385.4$ MHz, $F_{TXIFGSM}$ and $F_{TXIFDCS}$ should be within about 385.4 MHz 385.4 MHz±38.5 MHz, or within about 346.9 MHz to 423.9 MHz.

Figure 4:
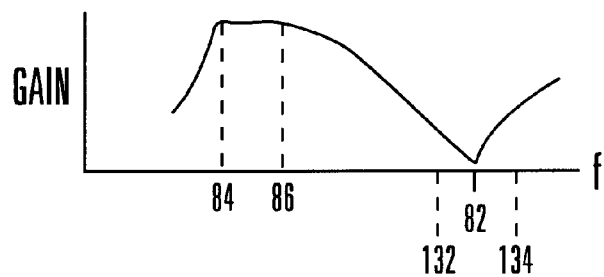
FIG. 4 is a plot in the frequency domain of the frequency response of a transmit IF filter according to an embodiment of the present invention.

Another reason for keeping GSM and DCS transmit IFs 104 ($F_{TXIFGSM}$ and $F_{TXIFDCS}$) close together is that, in order to utilize the same transmit IF filter 46 regardless of whether GSM or DCS is the operative communication standard, the transmit IFs 104 and, therefore, the resultant frequencies of the transmit IF information signals 32 for each communication standard should be close in frequency. Transmit IF filter 46 removes harmonics of the transmit IF information signal 32, but if the frequencies of the transmit IF information signals 32 for each communication standard are too far apart, the passband of transmit IF filter 46 may be so wide that harmonic rejection is inadequate. Therefore, as illustrated in FIG. 4, a design preference exists in that transmit IF filter 46 should have a frequency response with a passband sufficient to pass the frequency of the GSM transmit IF information signal $F_{TXIFGSM}$ (reference character 84) and the frequency of the DCS transmit IF information signal $F_{TXIFDCS}$ (reference character 86), and a stop band 82 sufficient to remove GSM transmit IF information signal third-order harmonics 132 and DCS transmit IF information signal third order harmonics 134.

The translation loop architecture of upconverter 48 in embodiments of the present invention illustrated in FIG. 3 imposes another set of design preferences. Two types of spurs may be generated by the translation loop, "zero-crossing spurs" and "4× modulation spurs." The choice of transmit IFs 104 for GSM and DCS, and transmit IF filter 48, can minimize these spurs.

Figure 5:
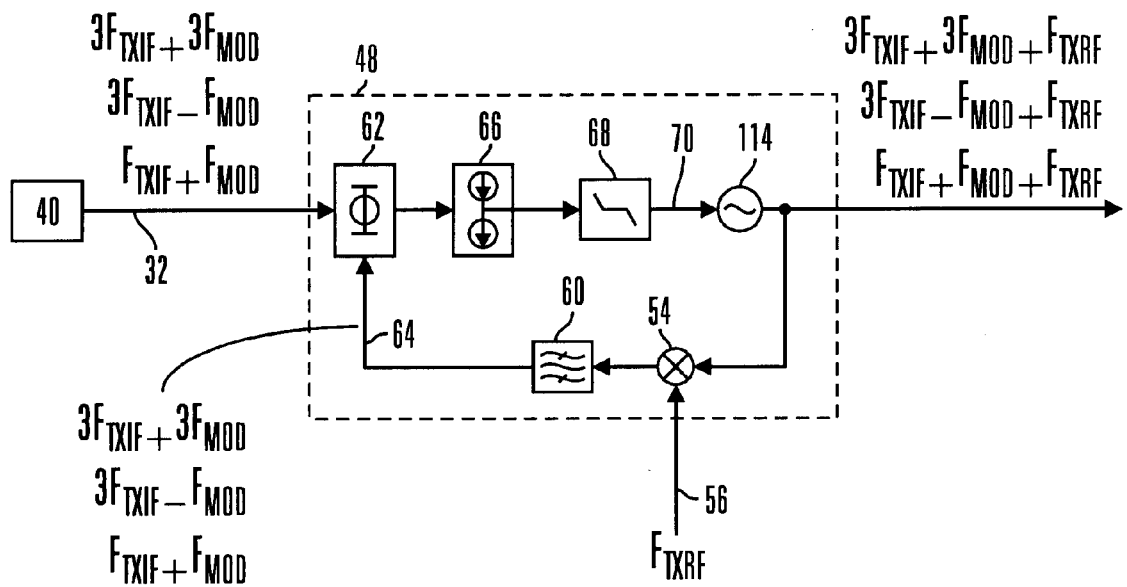
FIG. 5 is a block diagram of a conventional modulator and upconverter illustrating the formation of 4× modulation spurs.

In FIG. 5, where upconverter 48 is illustrated to produce only DCS frequencies for purposes of discussion only, 4× modulation spurs can occur if modulation electronics 40 provides an unfiltered transmit IF information signal 32 at a frequency $F_{TXIFMOD}$ to the feed-forward input of phase detector 62 within upconverter 48. For purposes of discussion only, assume for the moment that no transmit IF filter 46 exists, and that modulation electronics 40 generates a single sideband tone offset from and higher than transmit IF LO 104 ($F_{TXIF}$) by a frequency $F_{MOD}$. Thus, a tone at $F_{TXIFMOD}=F_{TXIF}+F_{MOD}$ enters the feed-forward input of phase detector 62. For the translation loop to be locked, the feed-back input to phase detector 62 (and hence the output of mixer 54 should also be $F_{TXIF}+F_{MOD}$. Because mixer 54 subtracts transmit RF LO 56 ($F_{TXRF}$) from the output of DCS frequency generator 114, the output of DCS frequency generator 114 should be at a frequency $F_{TXIF}+F_{MOD}+F_{TXRF}$.

Modulation electronics 40 also generates a 3rd harmonic tone offset from and lower than three times the transmit IF LO 104 ($3*F_{TXIF}$) by a frequency $F_{MOD}$. Thus, a tone at $3*F_{TXIF}-F_{MOD}$ also enters the feed-forward input of phase detector 62, and appears at the output of mixer 54. In addition, modulation electronics 40 also generates a 3rd harmonic of transmit IF information signal 32, and thus a tone at $3*F_{TXIFMOD}=3*F_{TXIF}+3*F_{MOD}$ enters the feed-forward input of phase detector 62 and appears at the feed-back input of phase detector 62. Because phase detector 62 acts like a mixer and produces sums and differences of its inputs, when the 3rd harmonic tone $3*F_{TXIF}-F_{MOD}$ appearing at the feed-forward input of phase detector 62 is subtracted from the 3rd harmonic of transmit IF information signal $3*F_{TXIF}+3*F_{MOD}$ appearing at the feed-back input of phase detector 62, the result is $4*F_{MOD}$, which produces two spurs on either side of the desired output of DCS frequency generator 114. These spurs are the 4× modulation spurs.

However, by coupling transmit IF filter 46 between modulation electronics 40 and upconverter 48 and imposing a design preference that transmit IF filter 46 suppress the 3rd harmonic of transmit IF information signal 32 ($3*F_{TXIF}+3*F_{MOD}$), the 4× modulation spurs will never be generated.

Figure 6:
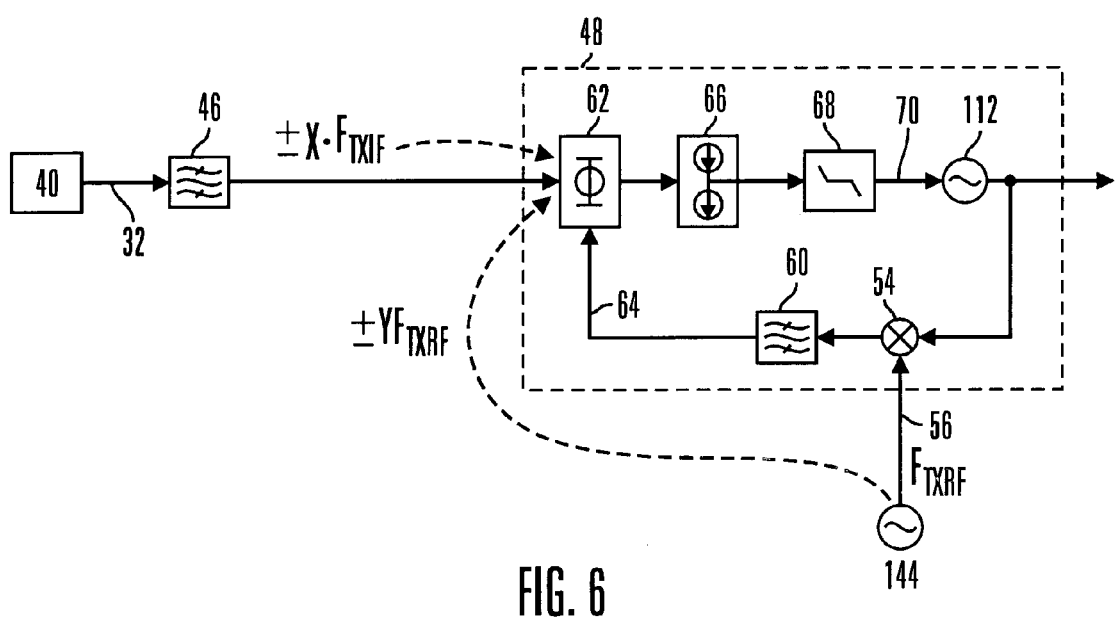
FIG 6 is block diagram illustrating the formation of zero-crossing spurs in an embodiment of the present invention.

In the embodiment of FIG. 6, where upconverter 48 is illustrated to produce only GSM frequencies for purposes of discussion only, zero-crossing spurs can occur when harmonics of filtered transmit IF information signal 50 are added to or subtracted from harmonics of transmit RF LO 56 to produce a baseband signal unfilterable by the translation loop. Phase detector 62 receives harmonics of transmit IF LO 104 that have leaked onto the feed-forward input of phase detector 62 at a frequency $X*F_{TXIF}$, where X is a positive integer, and also harmonics of transmit RF LO 56 that have leaked onto the feed-back input of phase detector 62 at a frequency $Y*F_{TXRF}$, where Y is a positive integer. Phase detector 62 acts like a mixer and produces sums and differences of its inputs, and thus will generate $\pm X*F_{TXIF}\pm Y*F_{TXRF}$. Alternatively, if feed-forward and feed-back dividers are employed, phase detector 62 will generate $\pm X*F_{TXI}F/D \pm Y*F_{TXRF}$, where D is the division ratio of the feed-forward and feed-back dividers. If the result is any low frequency signal within the passband of loop filter 68, it will not be filtered by loop filter 68 but will instead pass through and affect control voltage 70 and appear as spurs on the desired output of GSM frequency generator 112.

Therefore, the possibility of zero-crossing spurs necessitates the design preference that no sum or difference of any harmonic of filtered transmit IF information signal 50 and transmit RF LO 56 produce a result within the passband of loop filter 68 until the harmonics are of a sufficiently high order so that the zero-crossing spurs are within system requirements. (Higher order harmonics (high values of X and Y) has less RF power as compared to low order harmonics.)

The sharing of RF LO frequency source 144 in the embodiment illustrated in FIG. 3 imposes still other design preferences on dual-band communication system 100. RF LO frequency generator 152 includes an RF LO frequency source 144 that should be tunable to generate both GSM and DCS receive RFs 56 ($F_{RXRFGSM}$ and $F_{RXRFDCS}$) and GSM and DCS transmit RFs 58 ($F_{TXRFGSM}$ and $F_{TXRFDCS}$). However, to achieve the goal of utilizing the same RF LO frequency source 144 to generate these frequencies ($F_{RXRFGSM}$, $F_{RXRFDCS}$, $F_{TXRFGSM}$, and $F_{TXRFDCS}$), the difference between the transmit and receive frequencies for a given communication standard should not be too great, otherwise the tuning and settling times of the PLL within RF LO frequency generator 152 may be too long. Thus, in embodiments of the present invention, the frequencies $F_{RXRFGSM}$ and $F_{TXRFGSM}$ are selected to vary from each other by not more than about 10%, and the frequencies $F_{RXRFDCS}$ and $F_{TXRFDCS}$ are selected to vary from each other by not more than about 10%. Thus, because $F_{RXRFGSM}$=1335 to 1360 MHz, $F_{TXRFGSM}$ should be within the range of about 1201.5 to 1496 MHz. Because $F_{RXRFDCS}$=1405 to 1480 MHz, $F_{TXRFDCS}$ should be within the range of about 1264.5 to 1628 MHz.

Thus, selecting transmit IF LO 104, the passband of transmit IF filter 46, and transmit RF LO 56 involve the following competing preferences:

$F_{TXIFGSM}$ and $F_{TXIFDCS}$ should be within about 385.4 MHz 38.5 MHz, or within about 346.9 MHz to 423.9 MHz, to minimize total tuning range of IF LO frequency source 108.

Transmit IF filter 46 should have a frequency response with a passband sufficient to pass the frequency of the GSM transmit IF information signal $F_{TXIFGSM}$ (reference-character 84) and the frequency of the DCS transmit IF information signal $F_{TXIFDCS}$ (reference character 86), and a stop band 82 sufficient to remove GSM transmit IF information signal third-order harmonics 132 and DCS transmit IF information signal third order harmonics 134.

Transmit IF filter 46 should suppress the 3rd harmonic of transmit IF information signal 32 ($3*F_{TXIF}+3*F_{MOD}$) for both GSM and DCS to avoid 4x modulation spurs.

$X*F_{TXIFMOD}\pm Y*F_{TXRF}$> the passband of loop filter 68, where X and Y are positive integers, until X and Y are large enough so that the zero-crossing spurs are within system requirements.

$F_{TXIF}$ and $F_{TXRF}$ should be chosen such that no sum or difference of any low order harmonic of these two signals results in a baseband signal unfilterable by loop filter 68.

$F_{TXRFGSM}$ should be within about 1201.5 to 1496 MHz, and $F_{TXRFDCS}$ should be within about 1264.5 to 1628 MHz to minimize total tuning range of RF LO frequency source 144.

In preferred embodiments, $F_{TXIFGSM}$ is selected to be 368 MHz because it satisfies the above design preferences. Thus, $$F_{TXIFGSM}=F_{TXRFGSM}-\text{the GSM transmit band,}$$

and therefore 368 MHz=$F_{TXRFGSM}-$(890 to 915 MHz), and $F_{TXRFGSM}$=1258 to 1283 MHz.

In preferred embodiments, $F_{TXIFDCS}$ is selected to be 358 MHz because it satisfies the above design preferences. Thus, $$F_{TXIFDCS}=\text{the DCS transmit band}-F_{TXRFDCS,}$$

and therefore 358 MHz=(1710 to 1785 MHz)$-F_{TXRFDCS,}$ and $F_{TXRFDCS}$=1352 to 1427 MHz.

Because, in preferred embodiments of the present invention, $F_{TXIFGSM}$ is selected to be 368 MHz and $F_{TXIFDCS}$ is selected to be 358 MHz, transmit IF filter 46 is selected to have a center frequency of 363 MHz and a minimum bandwidth of about 14 MHz. It is also selected to provide a notch at 3×363 MHz=1089 MHz to equally suppress DCS third-order harmonics at 3×358 MHz=1074 MHz and GSM third-order harmonics at 3×368 MHz=1104 MHz.

A preferred embodiment of dual-band communication system 100 with a frequency plan satisfying the preceding design preferences is illustrated in FIG. 7. However, it should be understood that embodiments of the present invention can be extended to communication standards other than GSM and DCS and even to triple-band or other multi-band communication systems.

Therefore, according to the foregoing description, preferred embodiments of the present invention provide a system and process for a multi-band communication unit that shares the same frequency sources and filters between transmitters and receivers and between bands to minimize size, weight, complexity, power consumption, and cost.

The foregoing description of preferred embodiments of the invention has been presented for the purposes of illustration and description. It is not intended to be exhaustive or to limit the invention to the precise form disclosed. It is intended that the scope of the invention be limited not by this detailed description, but rather by the claims appended hereto.

What is claimed is:

1. A communication system for communicating RF signals at any one of a plurality of communication standards through a common antenna, each communication standard having a unique transmit band, receive band, and a common data rate, the communication system comprising:

a transmitting unit having a transmit RF information signal output, the transmitting unit having a modulator for transforming a transmit baseband information signal into a modulated transmit IF information signal and an upconverter for upconverting the transmit IF information signal into a transmit RF information signal;

a receiving unit having a receive RF information signal input, the receiving unit having a first downconverter for downconverting a receive RF information signal to a first receive IF information signal, a second downconverter for downconverting the first receive IF information signal to a second receive IF information signal, an analog-to-digital converter for converting the second receive IF information signal to a receive digital information signal, and a digital signal processor for processing the receive digital information signal; and an antenna coupled to the transmit RF information signal output and the receive RF information signal input for transmitting and receiving RF information signals;

wherein the digital signal processor uses a processing clock greater than or equal to about four times the data rate, the analog-to-digital converter operates at a sample rate selected such that no odd-order harmonic of one fourth of the sample rate substantially coincides with any harmonic of the processing clock, and the second IF carrier frequency for the second receive IF information signal is selected to be an odd-order harmonic of one fourth of the sample rate.

2. A communication system as recited in claim 1, further including an IF LO frequency generator coupled to the transmitting unit and receiving unit for generating a transmit IF LO used by the modulator for modulating the transmit baseband information signal and for generating a receive IF LO used by the second downconverter for downconverting the first receive IF information signal, an RF LO frequency generator coupled to the transmitting unit and receiving unit for generating a transmit RF LO used by the upconverter for upconverting the transmit IF information signal and for generating a receive RF LO used by the first downconverter for downconverting the receive RF information signal, and a reference source. coupled to the IF LO frequency generator and the RF LO frequency generator for providing a reference frequency to which the IF LO frequency generator and the RF LO frequency generator are phase-locked, the reference source being an integer multiple of the sample rate.

3. A communication system as recited in claim 2, the second downconverter comprising a second mixer for mixing the receive IF LO with the first receive IF information signal to produce the second receive IF information signal; and further including a second filter coupled between the second mixer and the analog-to-digital converter for filtering the second receive IF information signal, the second filter having a center frequency substantially equivalent to the second IF carrier frequency, a bandwidth no larger than approximately a modulation bandwidth of the second receive IF information signal, and a passband that does not substantially cover any harmonic of the processing clock.

4. A communication system as recited in claim 3, the first downconverter comprising a first mixer for mixing the receive RF LO with the receive RF information signal to produce the first receive IF information signal at a first IF carrier frequency, the receive RF LO having a frequency such that no low-order harmonics of the receive RF LO can be combined in the first mixer to generate an undesired signal at the first IF carrier frequency;

wherein the receive IF LO is equal to the second IF carrier frequency subtracted from the first IF carrier frequency.

5. A communication system as recited in claim 4, further including a first filter coupled between the first mixer and the second mixer for filtering the first receive IF information signal, the first filter having a center frequency substantially equivalent to the first IF carrier frequency, a bandwidth no larger than approximately a modulation bandwidth of the first receive IF information signal, and a passband that does not substantially cover any harmonic of the processing clock.

6. A communication system as recited in claim 2, wherein the transmit IF LO is different for each communication standard, each transmit IF LO varying from the receive IF LO by not more than approximately 10 percent of the receive IF LO.

7. A communication system as recited in claim 6, the upconverter comprising a translation loop having a mixer for mixing the transmit RF information signal with the transmit RF LO to produce a mixer output, a phase detector for detecting a phase difference between the transmit IF information signal and the mixer output, a loop filter for filtering a current representation of the phase difference through a passband, and at least one translation loop frequency source for adjusting the frequency of the transmit RF information signal based on the filtered current representation of the phase difference such that the transmit RF information signal is phase-locked to the transmit RF LO.

8. A communication system as recited in claim 7, further including a transmit IF filter coupled between the modulator and the translation loop, the transmit IF filter having a passband wide enough to cover the frequency of any transmit IF information signal produced under any of the plurality of communication standards but narrow enough to suppress the third harmonic of any transmit IF information signal produced under any of the plurality of communication standards.

9. A communication system as recited in claim 4, wherein the transmit RF LO and receive RFP LO for a particular communication standard vary by not more than approximately 10 percent.

10. A communication system as recited in claim 7, wherein the frequency of the transmit IF information signal and the transmit RF LO are selected such that no low-order harmonics of the transmit IF information signal and the transmit RF LO can be combined by the phase detector to produce a signal within the passband of the translation loop.

11. A communication system as recited in claim 1, wherein the plurality of communication standards comprises a GSM communication standard and a DCS communication standard, the processing clock is selected to be about 1.08333 MHz, the sample rate is selected to be about 19.5 MHz, and the second IF carrier frequency is selected to be about 14.6 MHz.

12. A communication system as recited in claim 2, wherein the reference source is selected to be equivalent to the sample rate.

13. A communication system as recited in claim 3, wherein the plurality of communication standards comprises a GSM communication standard and a DCS communication standard, and the second filter is selected to have a center frequency of about 14.6 MHz and a bandwidth of about 300 kHz.

14. A communication system as recited in claim 4, wherein the plurality of communication standards comprises a GSM communication standard and a DCS communication standard, the first IF carrier frequency is selected to be about 400 MHz, and the receive IF is selected to be about 385.4 MHz.

15. A communication system as recited in claim 5, wherein the plurality of communication standards comprises a GSM communication standard and a DCS communication standard, and the first filter is selected to have a center frequency of about 400 MHz and a bandwidth of about 300 kHz.

16. A communication system as recited in claim 10, wherein the plurality of communication standards comprises a GSM communication standard and a DCS communication standard, the transmit IF LO is selected to be about 368 MHz for GSM and about 358 MHz for DCS, and the transmit IF filter is selected to have a center frequency of about 363 MHz and a passband covering at least 358 to 368 MHz.

17. A communication system as recited in claim 9, wherein the plurality of communication standards comprises a GSM communication standard and a DCS communication standard, the receive RF LO is selected to be within a range of about 1335 to 1360 MHz for GSM and within a range of about 1405 to 1480 MHz for DCS, and the transmit RF LO is selected to be within a range of about 1258 to 1283 MHz for GSM and within a range of about 1352 to 1427 MHz for DCS.

18. A process for communicating RF signals at any one of a plurality of communication standards through a common antenna, each communication standard having a unique transmit band, receive band, and a common data rate, the process comprising:

transforming a transmit baseband information signal into a modulated transmit IF information signal, upconverting the transmit IF information signal into a transmit RF information signal, and transmitting the transmit RF information signal through the antenna;

receiving a receive RF information signal from the antenna, downconverting the receive RF information signal to a first receive IF information signal, and downconverting the first receive IF information signal to a second receive IF information signal;

converting the second receive IF information signal to a receive digital information signal at a sample rate and digitally filtering the receive digital information signal using a processing clock greater than or equal to about four times the data rate, the sample rate being selected such that no odd-order harmonic of one fourth of the sample rate substantially coincides with any harmonic of the processing clock; and selecting a second IF carrier frequency for the second receive IF information signal to be an odd-order harmonic of one fourth of the sample rate.

19. A process as recited in claim 18, further including the steps of generating a transmit IF LO for modulating the transmit baseband information signal, generating a receive IF LO for downconverting the first receive IF information signal, generating a transmit RF LO for upconverting the transmit IF information signal, generating a receive RF LO for downconverting the receive RF information signal, and providing a reference frequency to which the transmit IF LO, receive IF LO, transmit RF LO, and receive RF LO are phase-locked, the reference frequency being an integer multiple of the sample rate.

20. A process as recited in claim 19, wherein the step of downconverting the first receive IF information signal to a second receive IF information signal comprises mixing the receive IF LO with the first receive IF information signal to produce the second receive IF information signal; and further including the step of filtering the second receive IF information signal, the filtering step having a frequency response with a center frequency substantially equivalent to the second IF carrier frequency, a bandwidth no larger than approximately a modulation bandwidth of the second receive IF information signal, and a passband that does not substantially cover any harmonic of the processing clock.

21. A process as recited in claim 20, wherein the step of downconverting a receive RF information signal to a first receive IF information signal comprises mixing the receive RF LO with the receive RF information signal to produce the first receive IF information signal at a first IF carrier frequency, the receive RF LO having a frequency such that no low-order harmonics of the receive RF LO can be mixed to generate an undesired signal at the first IF carrier frequency;

further including the step of filtering the first receive IF information signal, the filtering step having a frequency response with a center frequency substantially equivalent to the first IF carrier frequency, a bandwidth no larger than approximately a modulation bandwidth of the first receive IF information signal, and a passband that does not substantially cover any harmonic of the processing clock; and further including the step of selecting the transmit RF LO and receive RF LO for each communication standard to vary by not more than approximately 10 percent of the highest transmit or receive RF LO.

22. A process as recited in claim 19, further including the step of selecting the transmit IF LO to be different for each communication standard, each transmit IF LO varying from the receive IF LO by not more than approximately 10 percent of the receive IF LO.

23. A process as recited in claim 22, wherein the step of upconverting the transmit IF information signal into a transmit RF information signal comprises the steps of mixing the transmit RF information signal with the transmit RF LO to produce a mixer output, detecting a phase difference between the transmit IF information signal and the mixer output, filtering a current representation of the phase difference through a passband, and adjusting the frequency of the transmit RF information signal based on the filtered current representation of the phase difference such that the transmit RF information signal is phase-locked to the transmit RF LO, and further including the step of selecting the frequency of the transmit IF information signal and the transmit RF LO such that no low-order harmonics of the transmit IF information signal and the transmit RF LO can be combined by the phase detecting step to produce a signal within the passband of the filtering step.

24. A process as recited in claim 23, further including the step of filtering the transmit IF information signal prior to the upconversion step, the filtering step having a frequency response with a passband wide enough to cover the frequency of any transmit IF information signal produced under any of the plurality of communication standards but narrow enough to suppress the third harmonic of any transmit IF information signal produced under any of the plurality of communication standards.

25. A communication system for communicating RF signals at any one of a plurality of communication standards through a common antenna, each communication standard having a unique transmit band, receive band, and a common data rate, the communication system comprising:

means for transforming a transmit baseband information signal into a modulated transmit IF information signal, upconverting the transmit IF information signal into a transmit RF information signal, and transmitting the transmit RF information signal through the antenna;

means for receiving a receive RF information signal from the antenna, downconverting the receive RF information signal to a first receive IF information signal, and downconverting the first receive IF information signal to a second receive IF information signal;

means for converting the second receive IF information signal to a receive digital information signal at a sample rate and digitally filtering the receive digital information signal using a processing clock greater than or equal to about four times the data rate, the sample rate being selected such that no odd-order harmonic of one fourth of the sample rate substantially coincides with any harmonic of the processing clock; and means for selecting a second IF carrier frequency for the second receive IF information signal to be an odd-order harmonic of one fourth of the sample rate.

26. A communication system as recited in claim 25, further including means for generating a transmit IF LO for modulating the transmit baseband information signal, means for generating a receive IF LO for downconverting the first receive IF information signal, means for generating a transmit RF LO for upconverting the transmit IF information signal, means for generating a receive RF LO for downconverting the receive RF information signal, and means for providing a reference frequency to which the transmit IF LO, receive IF LO, transmit RF LO, and receive RF LO may be phase-locked, the reference frequency being an integer multiple of the sample rate.

27. A communication system as recited in claim 26, wherein the means for downconverting the first receive IF information signal to a second receive IF information signal comprises means for mixing the receive IF LO with the first receive IF information signal to produce the second receive IF information signal; and further including means for filtering the second receive IF information signal, the means for filtering the second receive IF information signal having a frequency response with a center frequency substantially equivalent to the second IF carrier frequency, a bandwidth no larger than approximately a modulation bandwidth of the second receive IF information signal, and a passband that does not substantially cover any harmonic of the processing clock.

28. A communication system as recited in claim 27, wherein the means for downconverting a receive RF information signal to a first receive IF information signal comprises means for mixing the receive RF LO with the receive RF information signal to produce the first receive IF information signal at a first IF carrier frequency, the receive RF LO having a frequency such that no low-order harmonics of the receive RF LO can be mixed to generate an undesired signal at the first IF carrier frequency; and further including means for filtering the first receive IF information signal, the means for filtering the first receive IF information signal having a frequency response with a center frequency substantially equivalent to the first IF carrier frequency, a bandwidth no larger than approximately a modulation bandwidth of the first receive IF information signal, and a passband that does not substantially cover any harmonic of the processing clock;

wherein the transmit RF LO and receive RF LO for a particular communication standard vary by not more than approximately 10 percent.

29. A communication system as recited in claim 26, wherein the transmit IF LO is different for each communication standard, each transmit IF LO varying from the receive IF LO by not more than approximately 10 percent of the receive IF LO.

30. A communication system as recited in claim 29, wherein the means for upconverting the transmit IF information signal into a transmit RF information signal comprises means for mixing the transmit RF information signal with the transmit RF LO to produce a mixer output, detecting a phase difference between the transmit IF information signal and the mixer output, filtering a current representation of the phase difference through a passband, and adjusting the frequency of the transmit RF information signal based on the filtered current representation of the phase difference such that the transmit RF information signal is phase-locked to the transmit RF LO, and wherein no low-order harmonics of the transmit IF information signal and the transmit RF LO can be combined by the means for detecting a phase difference between the transmit IF information signal and the mixer output to produce a signal within the passband of the means for filtering a current representation of the phase difference through a passband.

31. A communication system as recited in claim 30, further including means for filtering the transmit IF information signal prior to the means for upconverting the transmit IF information signal into a transmit RF information signal, the means for filtering having a frequency response with a passband wide enough to cover the frequency of any transmit IF information signal produced under any of the plurality of communication standards but narrow enough to suppress the third harmonic of any transmit IF information signal produced under any of the plurality of communication standards.

* * * * *